United States Patent

Levi

[15] 3,644,803

[45] Feb. 22, 1972

[54] ELECTRICAL CONNECTIONS TO LOW TEMPERATURES

[72] Inventor: Mark W. Levi, Utica, N.Y.

[73] Assignee: The United States of America as represented by the Secretary of the United States Air Force

[22] Filed: Mar. 18, 1969

[21] Appl. No.: 808,123

[52] U.S. Cl. ....................317/235 R, 317/234 C, 317/235 B, 333/99 S

[51] Int. Cl. ....................H01l 11/14

[58] Field of Search ....................317/234, 256, 242–244, 317/25 C; 62/3; 307/277, 306, 307; 333/99; 174/5 C, 15

[56] References Cited

UNITED STATES PATENTS

| | | | |
|---|---|---|---|
| 3,258,664 | 6/1966 | Melngailis | 317/235 |
| 3,389,352 | 6/1968 | Kliphuis | 333/99 |
| 1,956,368 | 4/1934 | Wilde | 317/242 |

*Primary Examiner*—Jerry D. Craig
*Attorney*—Harry A. Herbert, Jr. and Ruth G. Codier

[57] ABSTRACT

An electrical lead-in conductor is effected from ambient to a cryogenic receptacle by means of a vacuum capacitor located in a vacuum surrounding the cryogenic receptacle. One plate of the capacitor leads from ambient to the vacuum area, the other from the vacuum area through the inner wall to the cold area. Heat leak along the conducting element is prevented by the break in the conducting element which the capacitance form of the lead affords.

1 Claim, 1 Drawing Figure

PATENTED FEB 22 1972 3,644,803
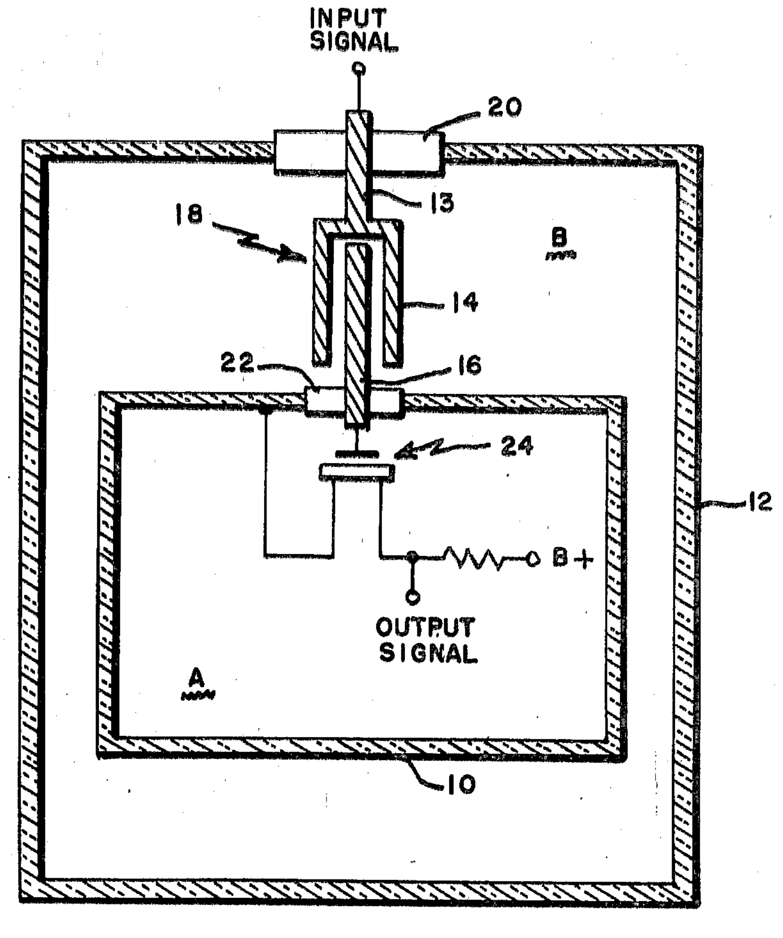
INVENTOR.
MARK W. LEVI
BY Harry A. Herbert Jr. and Ruth Cordier
ATTORNEYS

ELECTRICAL CONNECTIONS TO LOW TEMPERATURES

BACKGROUND OF THE INVENTION

This invention relates to apparatus for making electrical connections to a low-temperature environment and, more particularly, to the use of a vacuum capacitor for providing an electrical connection between the low-temperature region and the ambient area.

The problems arising in providing electrical connections from ambient areas to low-temperature regions have essentially to do with heat leakage and the increased costs of refrigeration of the low-temperature or cryogenic area. The heat leak results from two effects within the leads themselves. One is due to Joule heating within the leads and the other to heat conduction along the leads from the warmer ambient region to the cryogenic region. These problems become more acute when the transmitted frequencies are low.

Where many lead-in wires are required the effect is increased. Elimination of all heat leak is important, especially in cryogenic areas containing liquefied gas, where evaporation takes place at an extremely high rate.

The invention alleviates two effects described above, namely Joule heating within the leads and the heat conduction along the lead element by dividing the lead element in two in the form of a capacitor. The continuity of the lead is thus interrupted.

The presence of the vacuum alters the character of the capacitance and decreases the necessary energy input.

SUMMARY OF THE INVENTION

The invention relates to apparatus for making electrical connections to a low-temperature environment and more particularly to the use of a vacuum envelope and a vacuum capacitor for connecting a low-temperature region to an ambient area. The low-temperature region is surrounded by a vacuum for thermal isolation. The vacuum of the vacuum capacitor is a part of this surrounding vacuum.

The object of the invention is the provision of a device which permits electrical connections to be made to low-temperature environments without introducing appreciable heat leakage, and which overcomes the disadvantages of available devices used for this purpose and which reduces the cost of maintaining and refrigeration of cryogenic areas.

A further object of the invention is the introduction of a vacuum capacitor for thermal isolation of the cold chamber and for making possible large numbers of electrical connections to a cold chamber without the introduction of increased heat leak at the same time.

A further object of the invention is a device which provides a lead to a cryogenic area whose physical continuity is interrupted.

A further object of the invention is the provision of connections to cryogenic chambers containing multielement infrared detectors or containing multiline switching gear.

These and other advantages, features and objects of the invention will become more apparent from the following description taken in connection with the illustrative embodiments in the accompanying drawings.

DESCRIPTION OF THE DRAWINGS

The drawing is a diagrammatic representation of the device of the invention showing a dewar receptacle and vacuum capacitor.

DESCRIPTION OF THE PREFERRED EMBODIMENT

Referring more particularly to the drawing a cryogenic cold region A is maintained inside a double-walled dewar receptacle. The inner and outer walls of the receptacle are indicated by the numerals 10 and 12 respectively. The receptacle 10, including the cryogenic area A is located within a vacuum which is maintained in the outer receptacle 12.

The lead-in from ambient, to the cryogenic area comprises an electrical feedthrough element 20 having a conductor 13 and the two plate elements 14 and 16 of the vacuum capacitor 18. The first plate element 14 substantially surrounds but does not make direct physical contact with the second plate element 16.

The plate 16 of the vacuum capacitor 18 is lead from the vacuum area B through the electrical feedthrough element 22 in the wall 10, into the cryogenic area A, and to a field effect transistor 24 or extremely high impedance device the character of which depends upon the eventual use of the cryogenic device.

Although the invention has been described with reference to a particular embodiment it will be understood to those skilled in the art that the invention is capable of a variety of alternative embodiments within the spirit and scope of the appended claims.

I claim:

1. In an electrical connection for a cryogenic device, a dewar arrangement comprising an inner wall containing a cryogenic chamber and an outer wall containing a vacuum chamber, an electrical lead from ambient, through the outer wall, through the vacuum chamber, through the inner wall and into said cryogenic chamber, said electrical lead comprising a leadthrough element in said outer wall, a conductor leading from ambient to one plate of a vacuum capacitor located in said vacuum area, said capacitor comprising a first plate and second plate, said first plate being connected to the leadthrough element in said outer wall and having a receiving means therein and said second plate being spaced from said first plate, and being substantially surrounded by the receiving means in said first plate, constituting the gate electrode of a field effect transistor which is thermally connected and mounted upon said innerwall.

* * * * *